United States Patent
Guter et al.

(10) Patent No.: US 10,490,683 B2
(45) Date of Patent: Nov. 26, 2019

(54) STACKED INTEGRATED MULTI-JUNCTION SOLAR CELL

(71) Applicant: AZUR SPACE Solar Power GmbH, Heilbronn (DE)

(72) Inventors: Wolfgang Guter, Stuttgart (DE); Gerhard Strobl, Stuttgart (DE); Frank Dimroth, Gundelfingen (DE); Alexandre William Walker, Ottawa (CA)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 14/920,956

(22) Filed: Oct. 23, 2015

(65) Prior Publication Data
US 2016/0118524 A1    Apr. 28, 2016

(30) Foreign Application Priority Data
Oct. 23, 2014 (EP) .................................... 14003616

(51) Int. Cl.
| H01L 31/06 | (2012.01) |
| H01L 31/0687 | (2012.01) |
| H01L 31/0693 | (2012.01) |

(52) U.S. Cl.
CPC ...... H01L 31/0687 (2013.01); H01L 31/0693 (2013.01)

(58) Field of Classification Search
CPC ............. H01L 31/0678; H01L 31/0693; H01L 31/03046; H01L 31/0687; Y02E 10/544; Y02E 10/52
See application file for complete search history.

(56) References Cited

U.S. PATENT DOCUMENTS

| 2006/0185582 A1 | 8/2006 | Atwater, Jr. et al. |
| 2007/0137698 A1* | 6/2007 | Wanlass ................ H01L 31/042 136/261 |

(Continued)

FOREIGN PATENT DOCUMENTS

| CN | 103000759 A | 3/2013 |
| DE | 102012004734 A1 | 9/2013 |

(Continued)

OTHER PUBLICATIONS

Bissels et al., "Optimum Bandgap Calculations for a 4-Terminal Double tandem III-V Concentrator Solar Cell Structure," Proc. of the $22^{nd}$ Photovoltaic Solar Energy Conf., Milan, IT, pp. 1-4 (Sep. 2007).

(Continued)

*Primary Examiner* — Uyen M Tran
(74) *Attorney, Agent, or Firm* — Muncy, Geissler, Olds & Lowe, P.C.

(57) ABSTRACT

A stacked integrated multi-junction solar cell, having a first subcell, whereby the first subcell has a layer of an InGaP compound with a first lattice constant and a first band gap energy, and the thickness of the layer is greater than 100 nm and the layer is formed as part of an emitter and/or as part of the base and/or as part of the space charge region lying between the emitter and base, and a second subcell with a second lattice constant and a second band gap energy, and a third subcell with a third lattice constant and a third band gap energy, and a fourth subcell with a fourth lattice constant and a fourth band gap energy, and a region with a wafer bond is formed between two subcells.

25 Claims, 3 Drawing Sheets

(56) References Cited

U.S. PATENT DOCUMENTS

| | | | |
|---|---|---|---|
| 2008/0257405 A1 | 10/2008 | Sharps | |
| 2009/0229659 A1 | 9/2009 | Wanlass et al. | |
| 2010/0006143 A1 | 1/2010 | Welser | |
| 2010/0180936 A1 | 7/2010 | Kim | |
| 2010/0300506 A1* | 12/2010 | Heng | H01L 31/03529 136/244 |
| 2012/0138116 A1 | 6/2012 | Bhusari et al. | |
| 2013/0048064 A1 | 2/2013 | McMahon et al. | |
| 2013/0092218 A1* | 4/2013 | Bedell | H01L 31/0725 136/255 |
| 2013/0122638 A1* | 5/2013 | Jones-Albertus | H01L 31/06 438/74 |
| 2014/0345680 A1* | 11/2014 | Yoshida | H01L 31/0352 136/255 |
| 2015/0053257 A1 | 2/2015 | Dimroth et al. | |

FOREIGN PATENT DOCUMENTS

| | | | | |
|---|---|---|---|---|
| EP | 2 645 429 A1 | | 10/2013 | |
| JP | WO2013042526 | * | 3/2013 | ............ H01L 31/00 |
| RU | 2 376 679 C1 | | 12/2009 | |

OTHER PUBLICATIONS

Wolfgang Guter, Optimierung von III-V basierten Hochleistungssolarzellen (Optimizing III-V-based high-efficiency solar cells), Dissertation, Univ. of Constance, Dept. of Physics, pp. 1-172 (2010).

Meusel et al., "II-V Multijunction Solar Cells—From Current Space and Terrestrial Products to Modern Cell Architectures," $5^{th}$ World Photovoltaic Energy Conf., Valencia, Spain, pp. 1-6 (Sep. 2010).

Guter et al., "Development, Qualification and Production of Space Solar Cells with 30% EOL Efficiency," European Space Power Conf., Noodwijkerhout, the Netherlands, pp. 1-4 (Apr. 2014).

Cornfeld et al., "Development of a Four Sub-Cell Inverted Metamorphic Multi-junction (IMM) Highly Efficient AM0 Solar Cell," $35^{th}$ IEEE PVSC, Honolulu, HI, USA, pp. 1-5 (2010).

Ulf Seidel, "Grenzflaechenuntersuchungen am Tunnelkontakt einer MOCVD-praeparierten Tandemsolarzelle," Dissertation, Humboldt Univ. of Berlin, pp. 1-157 (Sep. 1, 2007).

Boisvert et al., "Development of Advanced Space Solar Cells at Spectrolab," $35^{th}$ IEEE Photovoltaic Spec. Conf., Honolulu, HI, USA, pp. 1-5 (Jun. 2010).

Krause et al., "Wafer Bonded 4-Unction GaInP/GaAs/GaInAsP/GaInAs Concentrator Solar Cells," Proc. of AIP Conf., pp. 1-5 (2014).

Chiu et al., "Direct Semiconductor Bonded 5J Cell for Space and Terrestrial Applications," IEEE J. of Photovoltaics, vol. 4, No. 1, pp. 1-5.

Niemeyer et al., "Next Generation of Water-Bonded Multi-Junction Solar Cells," $29^{th}$ European Photovoltaic Solar Energy Conf & Exhib., pp. 1991-1995 (Sep. 22, 2014).

Sharps P R et al "Development of 20% efficient GaInAsP solar cells", Proceedings of the Photovoltaic Specialists Conference, 1993, Seiten 633-638, XP010113181, DOIU: 10.1109/PVSC.1993.347019, ISBN: 978-0-7803-1220-3.

* cited by examiner

STACKED INTEGRATED MULTI-JUNCTION SOLAR CELL

This nonprovisional application claims priority under 35 U.S.C. § 119(a) to European Patent Application No. 14003616.1, filed on Oct. 23, 2014, all of which is herein incorporated by reference.

BACKGROUND OF THE INVENTION

Field of the Invention

The invention relates to a stacked integrated multi-junction solar cell.

Description of the Background Art

Multi-junction solar cells made of different semiconductor materials have been studied for some years in order to achieve the highest possible efficiencies for converting sunlight into electrical energy with solar cells, [W. Guter, Optimization of III-V-based High-Efficiency Solar Cells, Dissertation, University of Constance, Faculty for Physics, 2011]. Multi-junction solar cells divide incident light among a plurality of solar subcells, stacked one above the other, with a different band gap energy. To achieve the highest efficiencies, the semiconductor materials and the band gap energy thereof must be matched to one another, so that each solar subcell, electrically connected in series, generates the same current if possible. Furthermore, apart from high efficiencies, a high radiation stability to high-energy electrons and/or protons (e.g., solar eruption) is also desirable for applications, including space applications.

Provided the semiconductor materials of the individual subcells of the stack have the same lattice constant, the subcells can be manufactured by means of an epitaxial method. A lattice-matched 4-fold AlInGaP/InGaAs/InGa-NAs/Ge solar cell is known from Meusel et al., III-V MULTIJUNCTION SOLAR CELLS—FROM CURRENT SPACE AND TERRESTRIAL PRODUCTS TO MODERN CELL ARCHITECTURES, 5$^{th}$ WCPEC, 2010, Valencia, 1AP.1.5. Only insufficient efficiencies are achieved because of crystal quality particularly of the InGaNAs subcell.

If the subcells have different lattice constants, in a first alternative, metamorphic buffer layers are used between two subcells. A sequence of AlInGaP/AlInGaAs/InGaAs subcells, a metamorphic buffer, and Ge is known from Guter et al., DEVELOPMENT, QUALIFICATION AND PRODUCTION OF SPACE SOLAR CELLS WITH 30% EOL EFFICIENCY, European Space Power Conference, 2014, Noordwijkerhout, The Netherlands. Furthermore, another sequence of InGaP/GaAs subcells with a first metamorphic buffer, a first InGaAs subcell and a second metamorphic buffer and a second InGaAs subcell is known from Cornfeld et al., Development of a Four Sub-cell Inverted Metamorphic Multi-junction (IMM) Highly Efficient AM0 Solar Cell, 35$^{th}$ IEEE PVSC, 2010, Honolulu, USA.

A further alternative for combining materials with a different lattice constant is the use of wafer bonding methods. In this case, subcells with different lattice constants are joined. Bonded solar cell stacks with four subcells are known from the dissertation of Uwe Seidel, Interface studies on the tunneling contact of an MOCVD-prepared tandem solar cell, HU Berlin, Mathematical/Natural Science Faculty I, Jan. 9, 2007 and from J. Boisvert et al., Development of advanced space solar cells at spectrolab, in: Photovoltaic Specialists Conference (PVSC), 2010, 35$^{th}$ IEEE, 20-25 Jun. 2010, Honolulu, ISSN: 0160-8371, and from R. Krause et al., Wafer Bonded 4-Junction GaInP/GaAs//GaInAsP/GaInAs, AIP Conference Proceedings 1616, 45 (2014); doi: 10.1063/1.4897025. Further, a 5-fold solar cell stack with two bonded solar cell parts is known from P. T. Chiu et al., Direct Semiconductor Bonded 5J Cell For Space And Terrestrial Applications, IEEE Journal of Photovoltaics, Volume 4(1), pp. 493, 2014.

SUMMARY OF THE INVENTION

It is therefore an object of the invention is to provide a device that refines the prior art.

According to an embodiment of the invention, a stacked integrated multi-junction solar cell having a first subcell is provided, whereby the first subcell has a layer of an InGaP compound with a first lattice constant and a first band gap energy, and the thickness of the layer is greater than 100 nm and the layer is formed as part of the emitter and/or as part of the base and/or as part of the space charge region lying between the emitter and base, and a second subcell, whereby the second subcell has a layer of an $In_mP_n$ compound with a second lattice constant and a second band gap energy, and the thickness of the layer is greater than 100 nm and the layer is formed as part of the emitter and/or as part of the base and/or as part of the space charge region lying between the emitter and base, and a third subcell, whereby the third subcell has a layer of an $In_xGa_{1-x}As_{1-y}P_y$ compound with a third lattice constant and a third band gap energy, and the thickness of the layer is greater than 100 nm and the layer is formed as part of the emitter and/or as part of the base and/or as part of the space charge region lying between the emitter and base, and a fourth subcell, whereby the fourth subcell has a layer of an InGaAs compound with a fourth lattice constant and a fourth band gap energy, and the thickness of the layer is greater than 100 nm and the layer is formed as part of the emitter and/or as part of the base and/or as part of the space charge region lying between the emitter and base, whereby Eg1>Eg2>Eg3>Eg4 holds for the band gap energies, and a region with a wafer bond is formed between two subcells, and the region has a thickness of a maximum of 200 nm and the lattice constant in the region makes a jump of at least 0.01 nm and/or the crystal orientation changes in the region, and/or an amorphous intermediate layer is formed in the region, and the layer of the third subcell and the layer of the fourth subcell are lattice-matched to one another and/or a3=a4±Δ1 with Δ1≤0.003 nm, and 1>m>0.9 and 1>n>0.8 holds for the stoichiometry of the layer of the second subcell, and 1>x>0.2 and 1>y>0.1 holds for the stoichiometry of the layer of the third subcell.

It should be noted for reasons of clarity that the relation Eg1>Eg2>Eg3>Eg4 means that the first subcell has a higher band gap energy than the second subcell and the second subcell has a higher band gap energy than the third subcell and the third subcell has a higher band gap energy than the fourth subcell.

The subcell with the highest band gap energy can be arranged at the top on the stacked integrated multi-junction solar cell; i.e., the sunlight strikes the surface of the first subcell. After passing through the first subcell, the unabsorbed light strikes the second subcell until finally the long-wave range of light is absorbed in the fourth and lowermost subcell. If there is a support substrate for the stacked integrated multi-junction solar cell, the support substrate is always connected to the lowermost subcell. It should be noted that except for the region with the wafer bond the subcells below the wafer bond and above the wafer bond are monolithically integrated in each case. It should be noted further that the term "solar cell stack" can be used synonymously with the term "stacked integrated multijunction solar cell" and that a joining of two semiconductor wafers can be understood to be a "wafer bond."

An advantage is that the solar cell stack of the invention has a high efficiency and a plurality of radiation-hard subcells. In this case, more than one subcell with an InP compound can be used. In particular, especially radiation-stable materials are used such as AlInGaP and InP, as well as InGaAsP. Healing of radiation damage occurs even at temperatures below 300 K, whereas in GaAs-based subcells, healing begins only at temperatures above 600 K. Stated differently, a solar cell stack with a high efficiency can be produced by the joining of radiation-hard subcells with simultaneously matched band gaps, whereby due to the special radiation hardness the solar cell stack is also suitable preferably for space applications.

In an embodiment, a substrate can be formed from a compound of InP, GaAs, Ge, Si, and/or a metal. The substrates can be used as supports in the production of the two solar cell parts. In an exemplary embodiment, two substrates with lattice constants different from one another can be used. In an embodiment, one or more subcells are produced on each substrate by means of an epitaxy method. After the bonding of the subcells, at least the substrate on the first solar subcell is removed.

In an embodiment, the thickness of the layer of the fourth subcell is less than 2.2 μm and/or a semiconductor mirror is formed under the fourth solar subcell. The smaller the thickness of the layer, the higher the radiation stability of the subcell. Further, a semiconductor mirror can also be placed under the fourth subcell in order to reduce the layer thickness of the subcell. With the placement of the semiconductor mirror under the fourth subcell, a specific wavelength range is reflected by reflection in the absorption range of the overlying subcell. The optical path through the absorption range can be doubled hereby in a first approximation. In an embodiment, an optical back mirror can be provided under the fourth subcell, whereby the back mirror comprises a metal compound or a combination of a metal compound and a dielectric layer. It is achieved in a simple manner hereby that the light is reflected back again into the cell in a broadband manner.

The terms back mirror and optical mirror can be used synonymously hereafter. A precise adjustment of the semiconductor mirror to the wavelength range is omitted with the optical mirror. Further, an optical mirror is cost-effective and simple to produce and has a much higher reflectance than a semiconductor mirror, namely, of nearly 100%. The operating temperature of the solar cell is significantly reduced, in particular in space, moreover, by the reflection of the infrared light not utilized by the multi-junction solar cell, and the efficiency of the multi-junction solar cell is increased further thereby.

In an embodiment, the semiconductor mirror is formed between the third and fourth subcell. The semiconductor mirror reflects preferably the wavelength range of light that can be absorbed in the third subcell. The optical path of the light through the third subcell is lengthened by the semiconductor mirror. At the same time, longer-wave light can be transmitted for absorption in the fourth subcell.

In an embodiment, the optical mirror can be formed beneath the fourth subcell, in addition to the semiconductor mirror between the third subcell and the fourth subcell.

In an embodiment, the region in which the jump is formed has a thickness of a maximum of 100 nm and/or the lattice constant makes a jump of at least 0.015 nm. It can be understood that the term "region" describes an area that comprises the interface of the wafer bond, whereby the extent or thickness of the interface area constitutes only a few nanometers in most cases. In a preferred embodiment, the wafer bond and hereby the jump of the lattice constants are formed between the first subcell and the second subcell.

In an embodiment, the layer of the third subcell and the layer of the fourth subcell are lattice-matched to one another and/or $a3=a4\pm\Delta2$ with $\Delta2\leq0.0015$ nm holds for the lattice constants.

In an embodiment, $m>0.95$ and $n>0.9$ holds for the stoichiometry of the layer of the second subcell, and/or $x>0.65$ and $y>0.3$ holds for the stoichiometry of the layer of the third subcell. Stated differently, both subcells have layers with a very high phosphorus content greater than 90% in regard to group V elements and an at least high phosphorus content greater than 30% in regard to group V elements.

In an embodiment, the layer of the fourth subcell includes an InGaAsP compound, whereby the phosphorus content in regard to group V elements is greater than 5% and/or less than 30%.

In an embodiment, a fifth subcell is formed between the first subcell and the wafer bond, whereby the fifth subcell has a layer with a fifth lattice constant and a fifth band gap energy, and the thickness of the layer is greater than 100 nm and the layer is formed as part of the emitter and/or as part of the base and/or as part of the space charge region lying between the emitter and base, and whereby $Eg1>Eg5>Eg2$ holds for the band gap energy, and whereby $a5=a1\pm\Delta3$ with $\Delta3\leq0.01$ nm holds for the lattice constant. As a result, the fifth subcell has a band gap energy between the overlying first subcell and the underlying second subcell. The solar cell stack has five stacked subcells in succession.

In an embodiment, the band gap energy of the layer of the first subcell is greater than 1.88 eV and the band gap energy of the layer of the second subcell lies between 1.3 eV and 1.5 eV, and the band gap energy of the layer of the third subcell lies between 0.9 eV and 1.1 eV, and the band gap energy of the layer of the fourth subcell lies between 0.6 eV and 0.9 eV.

It is also advantageous, if the layer of the first subcell includes (Al)InGaP, and the layer of the second subcell includes InP, and the layer of the third subcell includes InGaAsP, and the layer of the fourth subcell includes InGaAs. Studies have shown that a combination of this type has a high efficiency.

In an embodiment, the band gap energy of the layer of the first subcell is greater than 2.0 eV and the band gap energy of the layer of the second subcell lies between 1.2 eV and 1.4 eV and the band gap energy of the layer of the third subcell lies between 0.9 eV and 1.1 eV and the band gap energy of the layer of the fourth subcell lies between 0.6 eV and 0.9 eV and the band gap energy of the layer of the fifth subcell lies between 1.4 eV and 1.7 eV.

In an embodiment, the layer of the first subcell includes AlInGaP, and the layer of the second subcell includes InP, and the layer of the third subcell includes InGaAsP, and the layer of the fourth includes InGaAs, and the layer of the fifth subcell includes Al(In)GaAs or of InGaAsP. In an alternative embodiment, the layer of the first subcell includes AlInGaP, and the layer of the second subcell includes InGaAsP, and the layer of the third subcell includes InGaAsP, and the layer of the fourth subcell includes InGaAs, and the layer of the fifth subcell includes Al(In)GaAs or of InGaAsP.

In an embodiment, the wafer bond is formed between the first subcell and the second subcell, whereby $a1<a2-0.01$ nm holds for the difference in the two lattice constants of the two subcells. The difference between the two lattice constants is at least 0.015 nm, most preferably at least 0.03 nm. The layer of the second subcell and the layer of the third subcell can be lattice-matched to one another and that $a2=a3\pm\Delta1$ or that $a2=a3\pm\Delta2$ holds for the lattice constant.

In an embodiment, a superstrate is connected to the first subcell by material bonding and the superstrate comprises a cover glass. The term superstrate in the present case can be understood to be a support on the top side of the solar cell stack. In an embodiment, the support substrate below the multi-junction solar cell is at least partially or totally unnecessary. An advantage is that very light solar cells can be produced as a result.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will be described in greater detail below with reference to the drawings. In this respect, similar parts are labeled with identical designations. The illustrated embodiments are highly schematized; i.e., the distances and the lateral and vertical extensions are not to scale and, if not otherwise indicated, also do not have any derivable geometric relations to one another. In the drawing.

DETAILED DESCRIPTION

Figure 1:
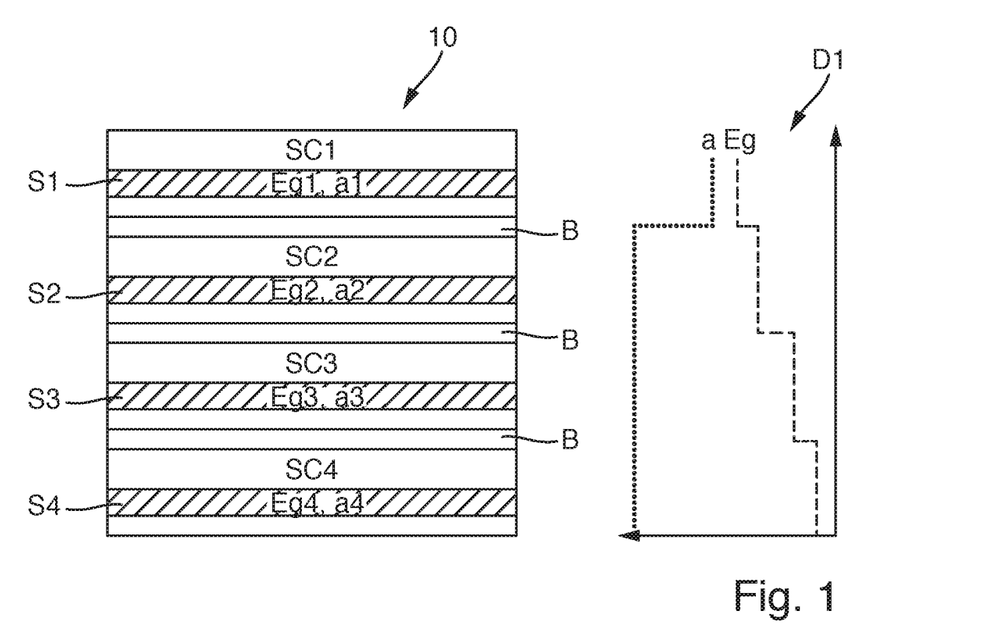
FIG. 1 shows a view of an exemplary embodiment with a fourfold solar cell.

FIG. 1 shows a view of a first embodiment of a stacked integrated multi-junction solar cell 10. The course of the lattice constant a and the band gaps Eg along the stack of multi-junction solar cell 10 is illustrated in an adjacent diagram D1.

Multi-junction solar cell 10 has a first subcell SC1, whereby first subcell SC1 has a layer S1 with a first lattice constant a1 and a first band gap energy Eg1. Further, multi-junction solar cell 10 has a second subcell SC2, whereby second subcell SC2 has a layer S2 with a second lattice constant a2 and a second band gap energy Eg2. Multi-junction solar cell 10 also has a third subcell SC3 with a layer S3 with a third lattice constant a3 and a third band gap energy Eg3. Furthermore, multi-junction solar cell 10 has a fourth subcell SC4, whereby fourth subcell SC4 has a layer S4 with a fourth lattice constant a4 and a fourth band gap energy Eg4. As shown in diagram D1, no difference in the band gap energy Eg and no difference in the lattice constant a between the particular layers S1, S2, S3, and S4 and the associated subcells SC1, SC2, SC3, and SC4. Stated differently, subcells SC1, SC2, SC3, and SC4 are intrinsically homogeneous with respect to the two parameters.

Connecting regions B are formed in each case between two adjacent subcells SC1 and SC2, and SC2 and SC3, and SC3 and SC4. A tunnel diode and further layers (not shown in each case) are formed in connecting regions B. According to the illustration in diagram D1, the band gap energies Eg1, Eg2, Eg3, and Eg4 of the individual subcells SC1, SC2, SC3, and SC4 and hereby also layers S1, S2, S3, and S4 in the individual subcells SC1, SC2, SC3, and SC4 fulfill the relation Eg1>Eg2>Eg3>Eg4.

As shown in diagram D1, a wafer bond with a jump in the lattice constant a is formed between first subcell SC1 and second subcell SC2. It should be noted that the jump in the lattice constant a comprises a value of at least 0.01 nm, preferably at least 0.015 nm, and most preferably at least 0.03 nm. Stated differently, the lattice constant a2 of second subcell SC2 is at least 0.01 nm greater than the lattice constant a1 of first subcell SC1; i.e., a1<a2−0.01 nm holds. Preferably, the difference between the two lattice constants a1 and a2 is at least 0.015 nm, most preferably at least 0.03 nm. It is understood that within the connecting region B the thickness of the region in which the jump is formed has a thickness of a maximum of 200 nm, preferably a maximum of 100 nm, and most preferably a maximum of 50 nm.

In addition, layer S2 of second subcell SC2 and layer S3 of third subcell SC3 and layer S4 of fourth subcell SC4 are each lattice-matched to one another. It holds for the lattice constants a2, a3, and a4 of layers S2, S3, and S4 of the individual subcells SC2, SC3 and SC4 that $a2=a3\pm\Delta1$ and $a2=a4\pm\Delta1$ with $\Delta1\le0.003$ nm; preferably $a2=a3\pm\Delta2$ and $a2=a4\pm\Delta2$ with $\Delta2=0.0015$ nm holds for the lattice constant.

Further, $1>m>0.9$ and $1>n>0.8$ holds for the stoichiometry of layer S2 of second subcell SC2, and $1>x>0.2$ and $1>y>0.1$ holds for the stoichiometry of layer S3 of third subcell SC3. Preferably, $m>0.95$ and $n>0.9$ holds for the stoichiometry of layer S2 of second subcell SC2 and/or $x>0.65$ and $y>0.3$ for the stoichiometry of layer S3 of third subcell SC3. As a result, subcells SC2 and SC3 have a high phosphorus content.

A further feature (not shown) of the wafer bond is that the crystal orientation changes in the region of the wafer bond. An amorphous intermediate layer (not shown) is also formed in general in the region.

Further, the thickness of layer S1 of first subcell SC1 is greater than 100 nm, whereby layer S1 is formed as part of the emitter and/or as part of the base and/or as part of the space charge region lying between the emitter and base. Preferably, first subcell SC1 comprises an InGaP compound.

Further, the thickness of layer S2 of second subcell SC2 is greater than 100 nm, whereby layer S2 is formed as part of the emitter and/or as part of the base and/or as part of the space charge region lying between the emitter and base. Preferably, second subcell SC2 comprises an $In_mP_n$ compound.

The thickness of layer S3 of third subcell SC3 as well is greater than 100 nm, whereby layer S3 is formed as part of the emitter and/or as part of the base and/or as part of the space charge region lying between the emitter and base. Preferably, third subcell SC3 comprises an $In_xGa_{1-x}As_{1-y}P_y$ compound.

Further, the thickness of layer S4 of fourth subcell SC4 is also greater than 100 nm, whereby layer S4 is formed as part of the emitter and/or as part of the base and/or as part of the space charge region lying between the emitter and base. Preferably, fourth subcell SC4 comprises an InGaAs compound.

Figure 2:
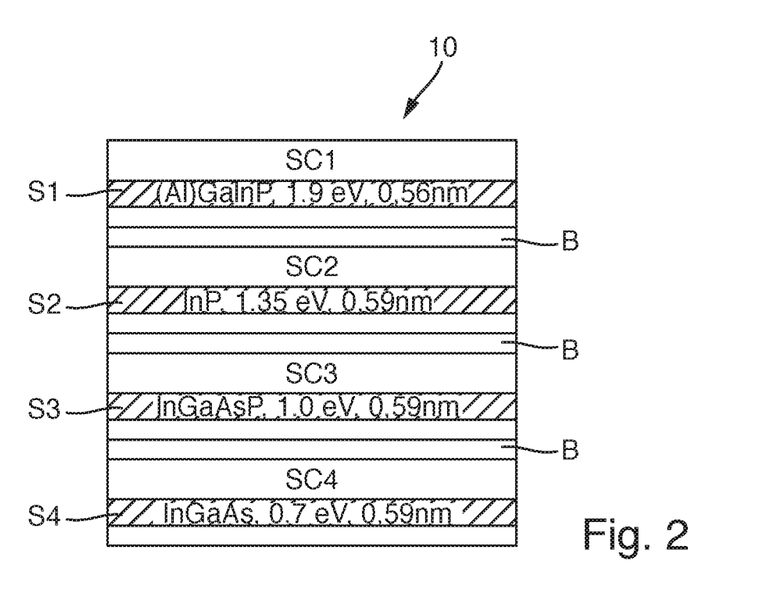
FIG. 2 shows a detailed view of the embodiment shown in FIG. 1.

A detailed view of the first embodiment shown in FIG. 1 is disclosed in the illustration of FIG. 2. Only the differences to the explanations in relation to the illustration in FIG. 1 will be indicated hereafter.

Layer S1 of first subcell SC1 has a lattice constant a1 of 0.56 nm and comprises an (Al)GaInP compound with a band gap energy Eg1 of 1.9 eV. Further, layer S2 of second subcell SC2 has a lattice constant a2 of 0.59 nm and comprises an InP compound with a band gap energy Eg2 of 1.35 eV. Furthermore, layer S3 of third subcell SC3 has a lattice constant a3 of 0.59 nm and comprises an InGaAsP compound with a band gap energy Eg3 of 1.0 eV. Finally, layer S4 of fourth subcell SC4 has a lattice constant a4 of 0.59 nm and comprises an InGaAs compound with a band gap energy Eg4 of 0.7 eV.

Figure 3:
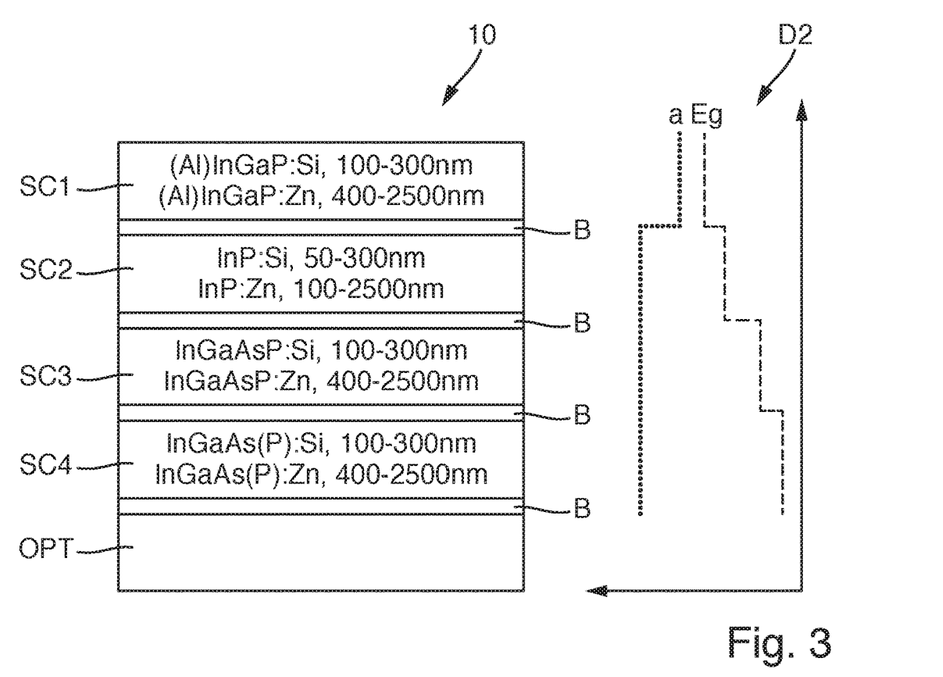
FIG. 3 shows a view of an exemplary embodiment with a fourfold solar cell with an optical mirror.

The illustration of FIG. 3 shows a view of a second embodiment with a fourfold solar cell. Only the differences to the previous embodiments will be indicated below.

The course of the lattice constant a and the course of the band gap energy Eg for subcells SC1 to SC4 are plotted in a diagram D2.

Layers S1 to S4 of first subcell SC1 to fourth subcell SC4 are fused with the respective subcells SC1 to SC4. An optical mirror or back mirror OPT is formed beneath fourth subcell SC4.

First subcell SC1 has a total thickness between 500 nm to 2800 nm with an (Al)InGaP compound. Preferably, the emitter and the space charge region and the base of first subcell SC1 is formed entirely of the (Al)InGaP compound. The total thickness divides into a first n-doped region with a thickness of 100 nm to 300 nm and a p-doped region with a thickness of 400 nm to 2500 nm. The n-doped region has an Si doping and the p-doped region a Zn doping.

Second subcell SC2 has a total thickness of 150 nm to 2800 nm to and comprises an InP compound. Preferably, the emitter and the space charge region and the base of second subcell SC2 is formed entirely of the InP compound. The total thickness divides into a first n-doped region with a thickness of 50 nm to 300 nm and a p-doped region with a thickness of 100 nm to 2500 nm. The n-doped region has an Si doping and the p-doped region a Zn doping.

Third subcell SC3 has a total thickness of 1100 nm to 2800 nm and comprises an InGaAsP compound. Preferably, the emitter and the space charge region and the base of third subcell SC3 is formed entirely of the InGaAsP compound. The total thickness divides into a first n-doped region with a thickness of 100 nm to 300 nm and a p-doped region with a thickness of 1000 nm to 2500 nm. The n-doped region has an Si doping and the p-doped region a Zn doping.

Fourth subcell SC4 has a total thickness of 1100 nm to 2800 nm and comprises an InGaAs(P) compound. Preferably, the emitter and the space charge region and the base of fourth subcell SC4 is formed entirely of the InGaAs(P) compound. The total thickness divides into a first n-doped region with a thickness of 100 nm to 300 nm and a p-doped region with a thickness of 1000 nm to 2500 nm. The n-doped region has an Si doping and the p-doped region a Zn doping.

Figure 4:
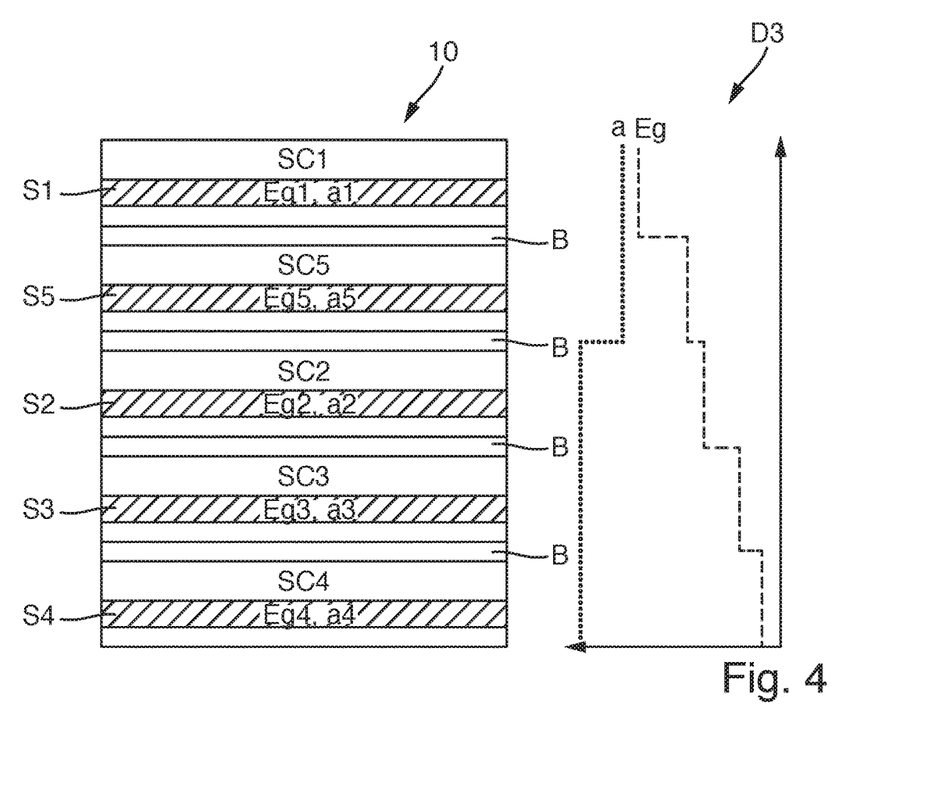
FIG. 4 shows a view of an exemplary embodiment with a fivefold solar cell.

The illustration in FIG. 4 shows a view of a third embodiment with a fivefold solar cell. Only the differences to the previous embodiments will be indicated below.

A fifth subcell SC5 with a layer S5 with a fifth lattice constant a5 and a fifth band gap energy Eg5 is formed between first subcell SC1 and second subcell SC2. The thickness of layer S5 of fifth subcell SC5 is greater than 100 nm, whereby layer S5 is formed as part of the emitter and/or as part of the base and/or as part of the space charge region lying between the emitter and base.

The course of the lattice constant a and the course of the band gap energy Eg for subcells SC1 to SC5 is plotted in a diagram D3. Accordingly, in the present embodiment the wafer bond is formed between fifth subcell SC5 and second subcell SC2. Further, first subcell SC1 and fifth subcell SC5 are formed lattice-matched to one another and have the same lattice constant a. Furthermore, second subcell SC2 up to and including fourth subcell SC4 are likewise each formed lattice-matched to one another and have the same lattice constant a. The band gap energy Eg5 of layer S5 of fifth subcell SC5 is greater than the band gap energy Eg2 of layer S2 of second subcell SC2 and less than the band gap energy Eg1 of layer S1 of first subcell SC1.

Figure 5:
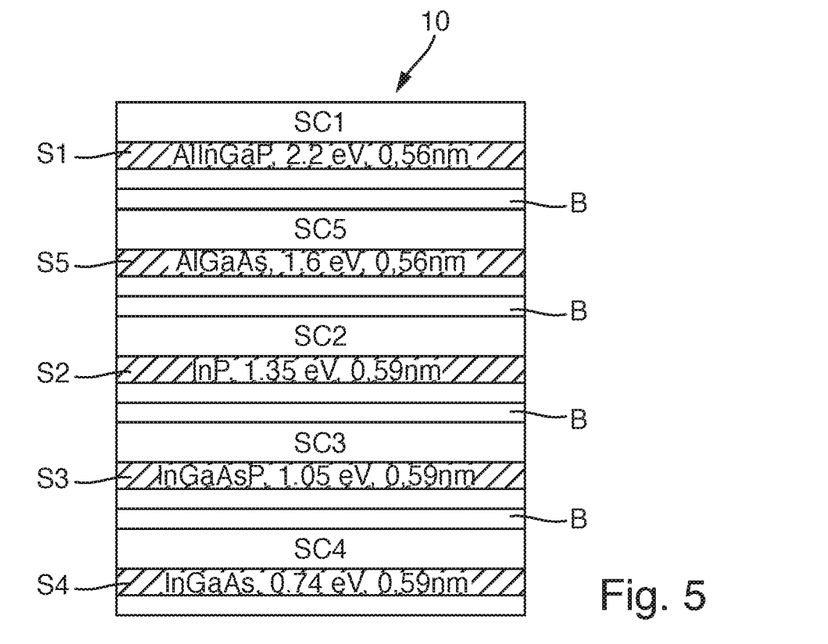
FIG. 5 shows a detailed view of the embodiment shown in FIG. 4.

The illustration in FIG. 5 shows a detailed view of a third embodiment with the fivefold solar cell, shown in relation to the drawings in FIG. 4. Only the differences to the previous embodiments will be indicated below.

Layer S1 of first subcell SC1 has a lattice constant a1 of 0.56 nm and comprises an AlGaInP compound with a band gap energy Eg1 of 2.2 eV. Further, layer S5 of fifth subcell SC5 has a lattice constant a5 of 0.56 nm and comprises an AlGaAs compound with a band gap energy Eg5 of 1.6 eV. Further, layer S2 of second subcell SC2 has a lattice constant a2 of 0.59 nm and comprises an InP compound with a band gap energy Eg2 of 1.35 eV. Furthermore, layer S3 of third subcell SC3 has a lattice constant a3 of 0.59 nm and comprises an InGaAsP compound with a band gap energy Eg3 of 1.05 eV. Finally, layer S4 of fourth subcell SC4 has a lattice constant a4 of 0.59 nm and comprises an InGaAs compound with a band gap energy Eg4 of 0.74 eV.

Figure 6:
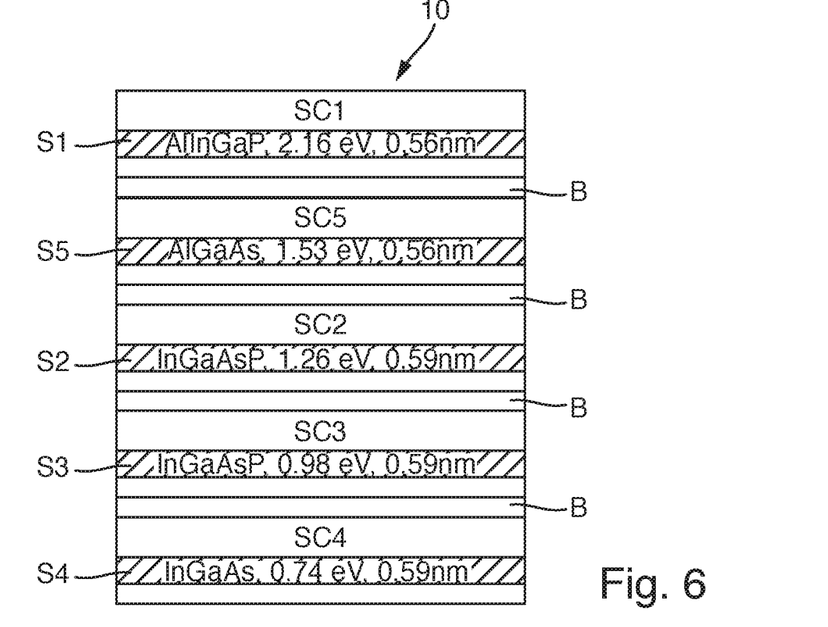
FIG. 6 shows a different detailed view of the embodiment shown in FIG. 4.

The illustration in FIG. 6 shows a further detailed view of a third embodiment with the fivefold solar cell, shown in relation to the drawings in FIG. 4. Only the differences to the previous embodiments will be indicated below.

Layer S1 of first subcell SC1 has a lattice constant a1 of 0.56 nm and comprises an AlInGaP compound with a band gap energy Eg1 of 2.16 eV. Further, layer S5 of fifth subcell SC5 has a lattice constant a5 of 0.56 nm and comprises an AlGaAs compound with a band gap energy Eg5 of 1.53 eV. Further, layer S2 of second subcell SC2 has a lattice constant a2 of 0.59 nm and comprises an InGaAsP compound with a band gap energy Eg2 of 1.26 eV. Furthermore, layer S3 of third subcell SC3 has a lattice constant a3 of 0.59 nm and comprises an InGaAsP compound with a band gap energy Eg3 of 0.98 eV. Finally, layer S4 of fourth subcell SC4 has a lattice constant a4 of 0.59 nm and comprises an InGaAs compound with a band gap energy Eg4 of 0.74 eV.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked integrated multi-junction solar cell, comprising:
    a first subcell having a first layer of an InGaP compound with a first lattice constant (a1) and a first band gap energy (Eg1), a thickness of the first layer being greater than 100 nm, and the first layer being formed as part of an emitter or as part of a base or as part of a space charge region lying between the emitter and the base;
    a second subcell having a second layer of an $In_mP_n$ compound with a second lattice constant (a2) and a second band gap energy (Eg2), a thickness of the second layer being greater than 100 nm and the second layer being formed as part of the emitter or as part of the base or as part of the space charge region lying between the emitter and the base;

a third subcell having a third layer of an $In_xGa_{1-x}As_{1-y}P_y$ compound with a third lattice constant (a3) and a third band gap energy (Eg3), and a thickness of the third layer being greater than 100 nm and the third layer being formed as part of the emitter or as part of the base or as part of the space charge region lying between the emitter and the base;

a fourth subcell having a fourth layer of an InGaAs compound with a fourth lattice constant (a4) and a fourth band gap energy (Eg4), a thickness of the fourth layer being greater than 100 nm and the fourth layer being formed as part of the emitter or as part of the base or as part of the space charge region lying between the emitter and the base, wherein Eg1>Eg2>Eg3>Eg4 holds for the band gap energies, wherein a region with a wafer bond is formed between the first subcell and the second subcell, wherein the region has a thickness of a maximum of 200 nm, wherein a lattice constant change in the region is at least 0.01 nm, wherein the second layer of the second subcell and the third layer of the third subcell are lattice-matched to one another such that a2 is substantially equal to a3, wherein the third layer of the third subcell and the fourth layer of the fourth subcell are lattice-matched to one another such that a3 is substantially equal to a4, wherein 1≥m>0.9 and 1≥n>0.8 holds for the stoichiometry of the second layer of the second subcell, and 1>x>0.2 and 1>y>0.1 holds for the stoichiometry of the third layer of the third subcell, and wherein a first tunnel diode is arranged between the first subcell and the second subcell, a second tunnel diode is arranged between the second subcell and the third subcell, and a third tunnel diode is arranged between the third subcell and the fourth subcell.

2. The multi-junction solar cell according to claim 1, wherein a substrate is formed from a compound of InP/GaAs/Ge/Si and/or a metal.

3. The multi-junction solar cell according to claim 1, wherein the thickness of the fourth layer of the fourth subcell is less than 2.2 μm.

4. The multi-junction solar cell according to claim 1, wherein an optical back mirror is provided, and the optical back mirror comprises a metal compound or a combination of a metal compound and a dielectric layer.

5. The multi-junction solar cell according to claim 1, wherein the region in which a jump is formed has a thickness of a maximum of 100 nm, and/or the lattice constant in the region makes a jump of at least 0.015 nm.

6. The multi-junction solar cell according to claim 1, wherein the third layer of the third subcell and the fourth layer of the fourth subcell are lattice-matched to one another and/or a3=a4±Δ2 with Δ2≤0.0015 nm holds for the lattice constants.

7. The multi-junction solar cell according to claim 1, wherein m>0.95 and n>0.9 holds for the stoichiometry of the second layer of the second subcell, and/or x>0.65 and y>0.3 holds for the stoichiometry of the third layer of the third subcell.

8. The multi-junction solar cell according to claim 1, wherein the fourth layer of the fourth subcell includes an InGaAsP compound and the phosphorus content in regard to group V elements is greater than 5% and/or less than 30%.

9. The multi-junction solar cell according to claim 1, wherein a fifth subcell is formed between the first subcell and the wafer bond, wherein the fifth subcell has a fifth layer with a fifth lattice constant and a fifth band gap energy, and a thickness of the fifth layer is greater than 100 nm and the fifth layer is formed as part of the emitter and/or as part of the base and/or as part of the space charge region lying between the emitter and the base, and wherein Eg1>Eg5>Eg2 applies, and wherein a5=a1±Δ3 with Δ3≤0.01 nm holds for the lattice constant.

10. The multi-junction solar cell according to claim 1, wherein the band gap energy of the first layer of the first subcell is greater than 1.88 eV and the band gap energy of the second layer of the second subcell lies between 1.3 eV and 1.5 eV and the band gap energy of the third layer of the third subcell lies between 0.9 eV and 1.1 eV and the band gap energy of the fourth layer of the fourth subcell lies between 0.6 eV and 0.9 eV.

11. The multi-junction solar cell according to claim 1, wherein the first layer of the first subcell includes (Al)InGaP, and the second layer of the second subcell includes InP, and the third layer of the third subcell includes InGaAsP, and the fourth layer of the fourth subcell includes InGaAs.

12. The multi-junction solar cell according to claim 9, wherein the band gap energy of the first layer of the first subcell is greater than 2.0 eV and the band gap energy of the second layer of the second solar subcell lies between 1.2 eV and 1.4 eV and the band gap energy of the third layer of the third subcell lies between 0.9 eV and 1.1 eV and the band gap energy of the fourth layer of the fourth subcell lies between 0.6 eV and 0.9 eV and the band gap energy of the fifth layer of the fifth subcell lies between 1.4 eV and 1.7 eV.

13. The multi-junction solar cell according to claim 1, wherein the first layer of the first subcell includes AlInGaP, and the second layer of the second subcell includes InP, and the third layer of the third subcell includes InGaAsP, and the fourth layer of the fourth subcell includes InGaAs, and a fifth layer of a fifth subcell includes Al(In)GaAs or InGaAsP.

14. The multi-junction solar cell according to claim 1, wherein the first layer of the first subcell includes AlInGaP, and the second layer of the second subcell includes InGaAsP, and the third layer of the third subcell includes InGaAsP, and the fourth layer of the fourth subcell includes InGaAs, and a fifth layer of a fifth subcell includes Al(In)GaAs or InGaAsP.

15. The multi-junction solar cell according to claim 1, wherein the wafer bond is formed between the first subcell and the second subcell and wherein the second layer of the second subcell and the third layer of the third subcell are lattice-matched to one another and a2=a3±Δ1 or a2=a3±Δ2 applies.

16. The multi-junction solar cell according to claim 1, wherein a superstrate is connected to the first subcell by material bonding and the superstrate comprises a cover glass.

17. The multi-junction solar cell according to claim 3, wherein a semiconductor mirror or an optical mirror is formed beneath the fourth subcell.

18. The multi-junction solar cell according to claim 3, wherein a semiconductor mirror or an optical mirror is formed between the third subcell and fourth subcell.

19. The multi-junction solar cell according to claim 1, wherein $a3=a4\pm\Delta1$ with $\Delta1 \leq 0.003$ nm and/or $a2=a3\pm\Delta1$ with $\Delta1 \leq 0.003$ nm.

20. The multi-junction solar cell according to claim 1, wherein a first substrate of one of the first subcell, the second subcell, the third subcell, and the fourth subcell has a different lattice constant from a second substrate of another one of the first subcell, the second subcell, the third subcell, and the fourth subcell.

21. The multi-junction solar cell according to claim 1, wherein the matched band gaps across each subcell of the first subcell, the second subcell, the third subcell, and the fourth subcell provides radiation hardening.

22. The multi-junction solar cell according to claim 1, wherein a phosphorus content of the second subcell or the third subcell is at least 90% relative to other V group elements.

23. The multi-junction solar cell according to claim 1, wherein the second subcell, the third subcell, and the fourth subcell are monolithically integrated.

24. The multi-junction solar cell according to claim 1, wherein each solar subcell, electrically connected in series, generates a same current.

25. The multi-junction solar cell according to claim 1, wherein the second subcell, the third subcell, and the fourth subcell have lattice constants across each subcell that are substantially equal to each other.

* * * * *